United States Patent

Fairchild

[15] 3,678,892

[45] July 25, 1972

[54] PALLET AND MASK FOR SUBSTRATES

[72] Inventor: Albert R. Fairchild, Winston-Salem, N.C.

[73] Assignee: Western Electric Company, Incorporated, New York, N.Y.

[22] Filed: May 19, 1970

[21] Appl. No.: 48,670

Related U.S. Application Data

[62] Division of Ser. No. 732,965, May 29, 1968, Pat. No. 3,577,325.

[52] U.S. Cl. ....................................................118/504

[51] Int. Cl. ....................................................C23c 13/08

[58] Field of Search ..................................118/48–49.5, 500, 118/501, 502, 503, 504, 505; 156/11; 148/174, 175

[56] References Cited

UNITED STATES PATENTS

| | | | |
|---|---|---|---|
| 184,662 | 11/1876 | Radcliffe | 118/500 X |
| 2,239,770 | 4/1941 | Becker et al. | 118/49 UX |
| 2,475,434 | 7/1949 | Moss | 118/503 X |
| 3,302,612 | 2/1967 | Stutzman | 118/504 |
| 3,526,555 | 9/1970 | Alexander | 156/11 X |
| 3,556,951 | 1/1971 | Cerniglia et al. | 156/11 X |

*Primary Examiner*—Morris Kaplan

*Attorney*—H. J. Winegar, R. P. Miller and S. Gundersen

[57] ABSTRACT

A pallet and a mask for use in the manufacture of thin film components are machined from a block of high density fine grain pressed graphite to the desired size and shape. The graphite pallet and mask are plated with a flash of copper so that the copper may be dissolved or reacted with an acid to release the layer of precious metals which accumulate during repeated use of the pallet and mask. Thin film substrates are placed in the pallet and covered by the mask. In use, the assembled pallet and mask are inverted such that gravity forces the substrates against the mask to insure that the metal is deposited only on the desired areas of the substrate.

2 Claims, 7 Drawing Figures

3678892

PALLET AND MASK FOR SUBSTRATES

This application is a division of application Ser. No. 732,965, filed May 29, 1968 and Pat. No. 3,577,325 issued on May 4, 1971.

BACKGROUND OF THE INVENTION

1. Field of the Invention

In the manufacture of a thin film component, a metal conductor or circuit element is deposited on a selected area of a substrate. One method of making such a deposition is to cover the substrate with a mask leaving the selected area exposed. The masked substrate may then be positioned in a deposition chamber where metal is deposited on the exposed area of the substrate by high vacuum evaporation or sputtering.

2. Description of the Prior Art

The prior art masking facilities were not capable of handling large quantities of substrates reliably and economically. The mask must be accurately aligned with each substrate and effectively block the unexposed surfaces from the metal being deposited. The substrates vary slightly in dimensions due to slight inaccuracies which cannot be eliminated during their manufacture. For example, ceramic substrates made by molding a clay and binder and firing in a kiln will vary in size due to unavoidable inaccuracies in the molding of the raw substrates and to different shrinkages during firing of different batches of clay and binder. Prior art masking facilities could not handle large quantities of substrates and at the same time prevent the erroneous exposure of portions of the substrate due to slight variations in dimensions of the substrates.

SUMMARY OF THE INVENTION

An object of the present invention is a new and improved pallet and mask arrangement for manufacturing large quantities of thin film components. In accordance with these and other objects, the invention utilizes a mask and pallet wherein a plurality of thin film substrates are loaded into the pallet to align them accurately in a desired array. The mask is then placed over the pallet and the pallet and mask inverted such that the mask then becomes the carrier and support for the substrates. Gravity forces the substrates against the mask to insure that only the desired areas of the substrates are exposed. In one embodiment, the pallet and mask are made from graphite and have a thin coating of easily dissolvable metal thereon. The easily dissolvable metal may be removed by an acid solution to aid in the recovery of precious metals which have accumulated during use of the pallet and mask.

Referring to FIG. 1, there is shown a thin film resistor 10. The resistor 10 has a nonconductive substrate 11. A metallic resistive film, such as tantalum nitride, is deposited on the entire upper surface of the substrate 11. Previous metal terminations 13 and 14 are then deposited onto the resistive film at each end of the substrate 11.

DETAILED DESCRIPTION

Figure 1:
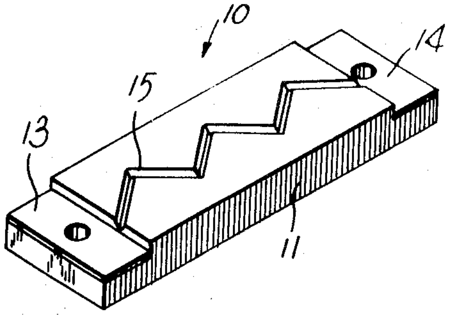
FIG. 1 is a plan view of a resistor substrate.

Referring to FIG. 1, there is shown a thin film resistor 10. The resistor 10 has a nonconductive substrate 11. A metallic resistive film, such as tantalum nitride, is deposited on the entire upper surface of the substrate 11. Previous metal terminations 13 and 14 are then deposited onto the resistive film at each end of the substrate 11. The terminations may be the chromium-palladium-gold terminations described in application Ser. No. 621,863, by P. M. Johnson, Jr., filed Mar. 9, 1967, and assigned to Western Electric Company, Inc. After the terminations 13 and 14 are formed, the raised center portion of the substrate 11 is abraded to leave the resinous film in the groove 15 having the desired value of resistance.

Figure 2:
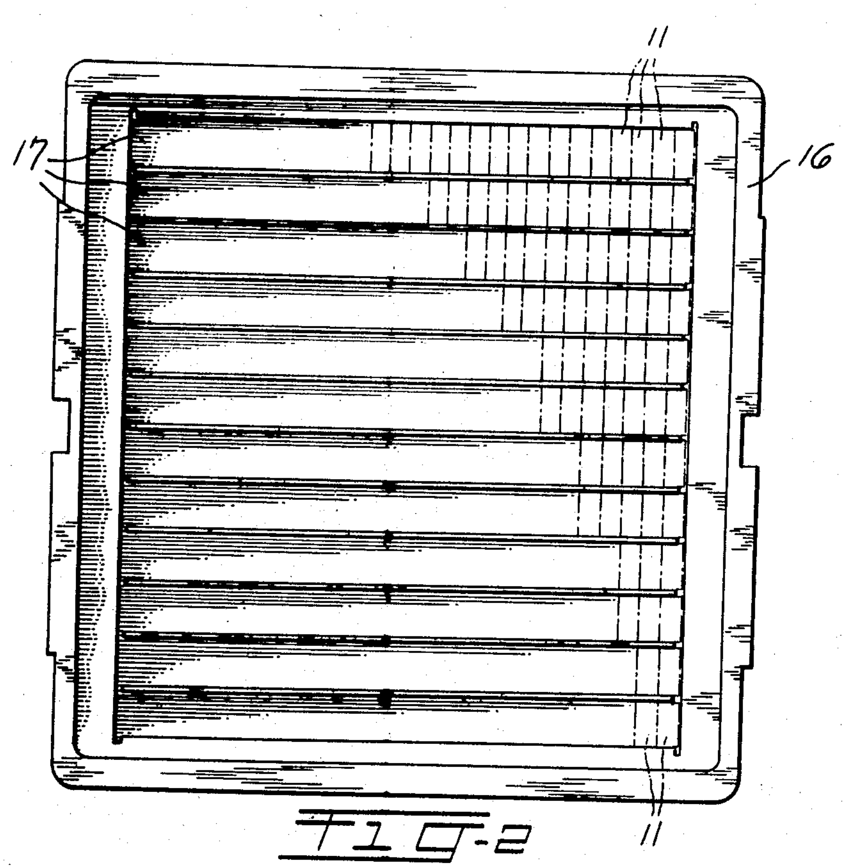
FIG. 2 is a plan view of a pallet for holding a plurality of the substrates shown in FIG. 1.
Figure 3:
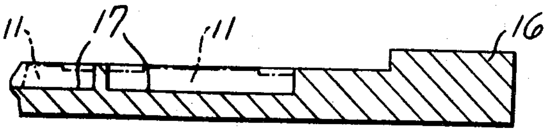
FIG. 3 is a partial cross-sectional side view of the pallet shown in FIG. 2.

Referring to FIGS. 2 and 3, there is shown a pallet 16 for receiving and aligning a plurality of substrates 11 upon which resistive films have been deposited. The pallets are made from a high density fine grain pressed graphite, such as that which is commercially available as P. G. Graphite, Grade EP 192, from Poco Graphite, Inc., of Garland. The pressed graphite is machined to form a plurality of parallel channels 17 for receiving the substrates 11 in side by side configuration as shown in FIG. 2. The substrates 11 are placed within the channels 17 and are held in a predetermined alignment in rows by the dimensions of the channels 17.

Figure 4:
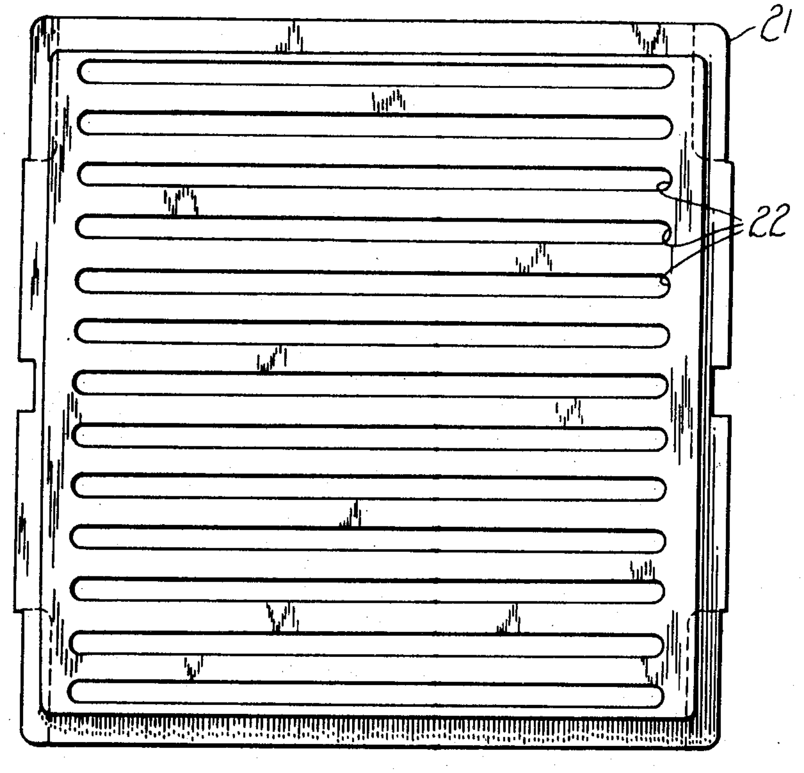
FIG. 4 is a plan view of a mask for mating with the pallet shown in FIG. 2.
Figure 5:
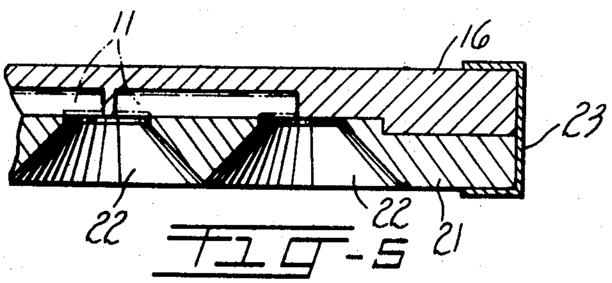
FIG. 5 is a partial cross-sectional side view of the mask shown in FIG. 4 and the pallet shown in FIGS. 4 and 5.

Referring now to FIGS. 4 and 5, there is shown a mask 21 which is designed to fit over the substrates 11 in the pallet 16 such that the end portions of the substrates 11 are exposed through beveled slots 22 which are parallel to the channels 17 of the pallet 16. The mask 21 is machined from pressed graphite which is the same graphite material used for the pallet 16. The pallet 16 and mask 21 are secured together by spring clips 23 placed over the edges of the pallet and mask. When the pallet 16 and mask 21 are inverted, as shown in FIG. 5, gravity forces the center portion of the substrates 11 tightly agaInSt the mask 21 to insure that only the end portions of the substrates 11 are exposed. This particular pallet and mask arrangement enables the handling of large quantities of substrates and at the same time insuring that deposition of metal is made only on the desired areas of the substrates.

Figures 6, 7:
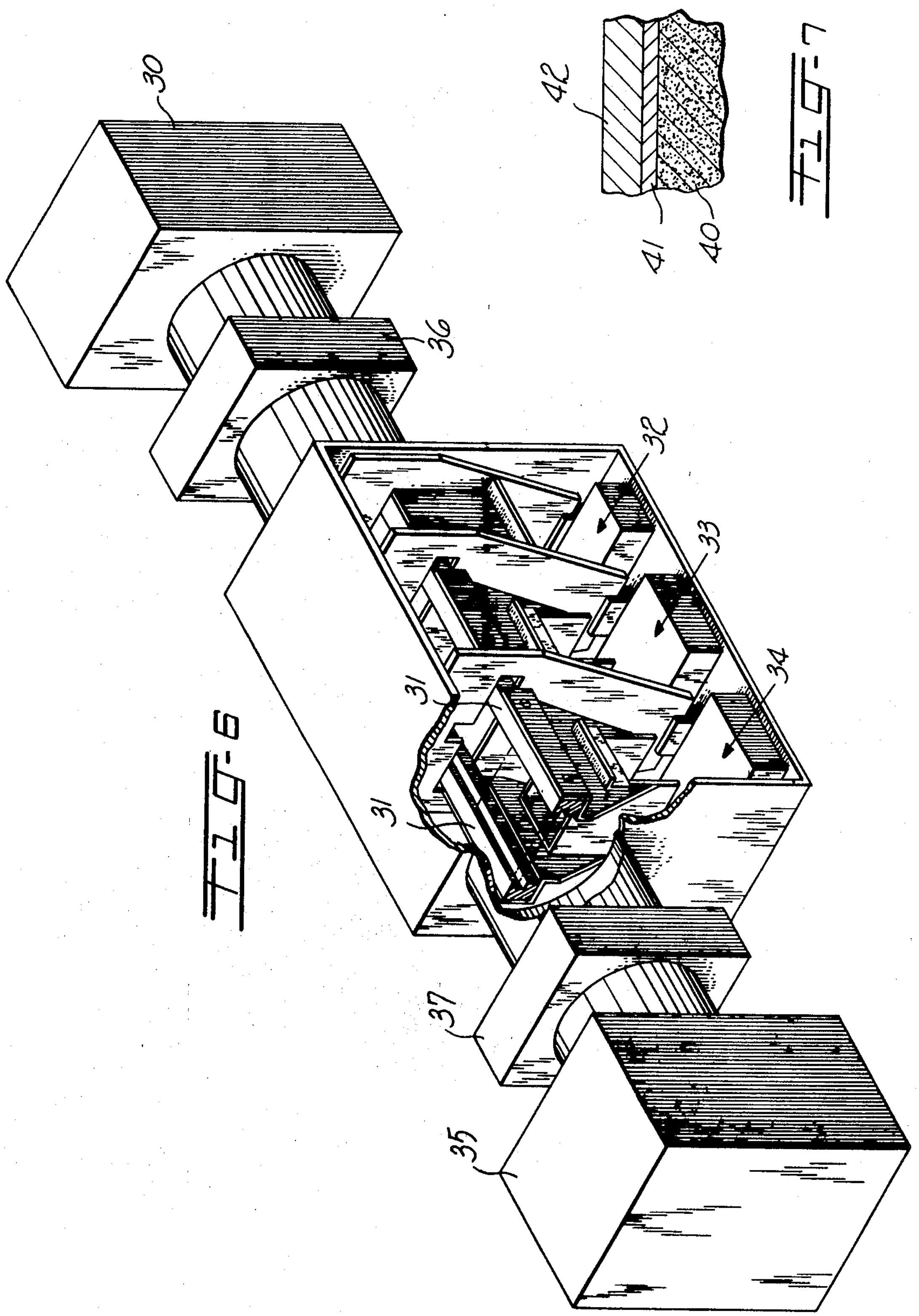
FIG. 6 is an isometric view of an apparatus utilizing the mask and pallets shown in FIGS. 2–5 for depositing metals on the substrates shown in FIG. 1.
FIG. 7 is an enlarged cross-sectional view of a portion of the mask and pallets shown in FIGS. 2–5 partially showing a layer of precious metal which has accumulated on a copper layer plated on a graphite base.

After the pallet 16 and the mask 21 have been formed from the pressed graphite material, the pallet 16 and the mask 21 are placed in an electrolytic bath of copper sulfate. Current is then passed through the graphite and electrolyte to plate a thin layer or flash of copper on the graphite. Referring to FIG. 7, the plated cross section shows the copper layer 41 plated on the graphite 40. The plated copper 41 may later be dissolved or reacted with an acid solution, such as dilute nitric acid, to free the precious metals 42 which accumulate during repeated use of the pallet and mask. The freed precious metals 42 are stripped from the pallet and mask and reclaimed by conventional processes. The stripped pallet and mask are then replated with a flash of copper to prepare them for reuse.

Referring now to FIG. 6, there is shown an evaporant apparatus for utilizing the pallet 16 and mask 21. The assembled pallets 16 and masks 21, containing substrates 11, are loaded into an enclosed chamber 20 which is isolated from the rest of the evaporating apparatus by valve 36. The chamber 30 is evacuated by a conventional arrangement of mechanical and diffusion vacuum pumps (not shown). After the chamber 30 is evacuated, the valve 36 may be opened. Suitable mechanism such as is described in U.S. Pat. No. 3,584,847, by C. S. Hammond, Jr., P. M. Johnson, Jr., J. C. Tribble and R. M. Tribble, and assigned to Western Electric Company, Inc., then sequentially advances the masks and pallets with the mask 21 facing downward along a pair of rails 31 over three evaporating chambers 32, 33 and 34, wherein the metals, chromium, palladium, and gold are successively evaporated on the exposed portions of the substrates 11 by conventional electron beam evaporators. The assembled pallets and masks are sequentially advanced into an unloading chamber 35 which is then isolated by a valve 37 to allow the assembled pallets and masks to be unloaded.

It is to be understood that the above-described embodiment is simply illustrative of the principles of the invention and that many other embodiments may be devised without departing from the scope and spirit of the invention.

What is claimed is:

1. A masking arrangement for handling and masking a plurality of substrates while a precious metal is deposited thereon and from which the precious metal may be removed without destroying the mask, comprising:

- a pallet for receiving and holding the plurality of substrates in an aligned configuration;
- a mask for mating with said pallet such that when said mask and pallet are inverted gravity forces the substrates against said mask leaving only the desired areas of the substrates exposed:
- both said pallet and mask made from graphite and having a thin coating of easily dissolvable metal on surfaces of said mask and pallet exposed to the depositing precious metal;
- said easily dissolvable metal being removable by an acid solution which does not attach or dissolve the precious metal or the graphite; and
- means for securing said mask and pallet together.

2. A masking arrangement as defined in claim 1 wherein said easily dissolvable metal is copper.

* * * * *